United States Patent
Lee et al.

(10) Patent No.: US 9,196,478 B2
(45) Date of Patent: Nov. 24, 2015

(54) GRAPHENE TRANSFERRING METHODS, DEVICE MANUFACTURING METHOD USING THE SAME, AND SUBSTRATE STRUCTURES INCLUDING GRAPHENE

(71) Applicant: Samsung Electronics Co., Ltd., Suwon-Si, Gyeonggi-Do (KR)

(72) Inventors: Joo-ho Lee, Hwaseong-si (KR);
Yong-sung Kim, Namyangju-si (KR);
Chang-youl Moon, Suwon-si (KR);
Sung-hee Lee, Suwon-si (KR);
Chang-seung Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/268,053

(22) Filed: May 2, 2014

(65) Prior Publication Data

US 2014/0335681 A1    Nov. 13, 2014

(30) Foreign Application Priority Data

May 7, 2013    (KR) .......................... 10-2013-0051500

(51) Int. Cl.
| H01L 29/66 | (2006.01) |
|---|---|
| H01L 21/02 | (2006.01) |
| H01L 29/16 | (2006.01) |
| H01L 21/20 | (2006.01) |

(52) U.S. Cl.
CPC ...... *H01L 21/02527* (2013.01); *H01L 21/0237* (2013.01); *H01L 21/0262* (2013.01); *H01L 21/02488* (2013.01); *H01L 21/02491* (2013.01); *H01L 21/02502* (2013.01); *H01L 21/02521* (2013.01); *H01L 21/2007* (2013.01); *H01L 29/1606* (2013.01); *H01L 29/66015* (2013.01)

(58) Field of Classification Search
CPC ................. H01L 21/02365; H01L 21/02436; H01L 21/02518; H01L 29/66007; H01L 29/66015

See application file for complete search history.

(56) References Cited

U.S. PATENT DOCUMENTS

| 2011/0030991 A1 | 2/2011 | Veerasamy |
|---|---|---|
| 2011/0070146 A1* | 3/2011 | Song et al. .................... 423/448 |

(Continued)

FOREIGN PATENT DOCUMENTS

| KR | 20110137564 A | 12/2011 |
|---|---|---|
| KR | 20120013604 A | 2/2012 |
| KR | 20130044646 A | 5/2013 |

OTHER PUBLICATIONS

Lee et al., Wafer-Scale Synthesis and Transfer of Graphene Films, 2010 American Chemical Society, Nano Letter 2010, 10, pp. 490-493.

(Continued)

*Primary Examiner* — Cheung Lee
(74) *Attorney, Agent, or Firm* — Harness, Dickey & Pierce

(57) ABSTRACT

Graphene transferring methods, a device manufacturing method using the same, and substrate structures including graphene, include forming a catalyst layer on a first substrate, forming a graphene layer on the catalyst layer, forming a protection metal layer on the graphene layer, attaching a supporter to the protection metal layer, separating the first substrate from the catalyst layer such that the protection metal layer, the graphene layer, and the catalyst layer remain on the supporter, removing the catalyst layer from the supporter, and transferring the protection metal layer and the graphene layer from the supporter to a second substrate.

19 Claims, 15 Drawing Sheets

(56) References Cited

U.S. PATENT DOCUMENTS

| | | | |
|---|---|---|---|
| 2011/0108521 A1* | 5/2011 | Woo et al. | 216/36 |
| 2011/0235626 A1 | 9/2011 | Yeon et al. | |
| 2012/0107562 A1* | 5/2012 | Bolotin et al. | 428/156 |
| 2013/0022811 A1* | 1/2013 | Ahn et al. | 428/336 |
| 2013/0098540 A1* | 4/2013 | Lee et al. | 156/230 |

OTHER PUBLICATIONS

Unarunotai et al., Transfer of Graphene Layers Grown on SIC Wafers to Other Substrates and Their Integration Into Field Effect Transistors, 2009 American Institute of Physics, Applied Physics Letters 95, 202101-1.

Hsu et al., Layer-By-Layer Graphene/TCNQ Stacked Films As Conducting Anodes for Organic Solar Cells, 2012 American Chemical Society vol. 6, No. 6, pp. 5031-5039.

Lemaitre et al., Improved Transfer of Graphene for Gated Schottky-Junction, Vertical, Organic, Field-Effect Transistors, 2012 American Chemical Society vol. 6, No. 10, pp. 9095-9102.

* cited by examiner

< COMPARATIVE EXAMPLE >

< EXAMPLE EMBODIMENTS >

GRAPHENE TRANSFERRING METHODS, DEVICE MANUFACTURING METHOD USING THE SAME, AND SUBSTRATE STRUCTURES INCLUDING GRAPHENE

CROSS-REFERENCE TO RELATED APPLICATION

This application claims the benefit of Korean Patent Application No. 10-2013-0051500, filed on May 7, 2013, in the Korean Intellectual Property Office, the disclosure of which is incorporated herein by reference in its entirety.

BACKGROUND

1. Field

Example embodiments relate to graphene transferring methods, device manufacturing methods using the same, and/or substrate structures including graphene.

2. Description of the Related Art

Graphene is a single-layer hexagonal structure formed of carbon atoms and may have structural and chemical stability, and exhibit excellent electrical and physical characteristics. For example, graphene has a charge mobility of up to about 2 har$^5$ cm$^2$/Vs, which is 100 times or more faster than that of silicon (Si), and a current density of about 10$^8$ A/cm$^2$, which is 100 times or more greater than that of copper (Cu). Also, graphene may have light transmission property (transparency) and may exhibit quantum characteristics at room temperature. Thus, graphene has drawn attention as a next generation material capable of overcoming the limitations of related art materials.

However, actually, manufacturing a device including graphene is not easy due to the limitations in graphene preparing processes. With existing technologies, it is difficult to grow high-quality graphene on an insulating thin film. Thus, graphene has to be formed on a metal thin film and then transferred onto another substrate. However, the graphene is not easy to handle, and may have some defects or be exposed to pollutants during the transfer of the graphene. In particular, polymethylmethacrylate (PMMA) that is a polymer material frequently used in a related graphene transferring method is difficult to be clearly removed from graphene, and thus PMMA residue is a factor to deteriorate a graphene property and a characteristic of a graphene device.

SUMMARY

Example embodiments relate to graphene transferring methods, device manufacturing methods using the same, and/or substrate structures including graphene.

Provided are graphene transferring methods in which damage or pollution to graphene is prevented or minimized and methods of manufacturing devices using the graphene transferring methods.

Provided are also graphene transferring methods without pollution due to polymer residue and methods of manufacturing devices to which the graphene transferring methods are applied.

Provided are also graphene transferring methods without damage in a wafer level (wafer scale) and methods of manufacturing devices to which the graphene transferring methods are applied.

Provided are also substrate structures manufactured by applying the graphene transferring methods and methods of manufacturing devices from the substrate structures.

According to some example embodiments, a graphene transfer method includes forming a catalyst layer on a first substrate, forming a graphene layer on the catalyst layer, forming a protection metal layer on the graphene layer, attaching a supporter to the protection metal layer; separating the first substrate from the catalyst layer such that the protection metal layer, the graphene layer, and the catalyst layer remain on the supporter, removing the catalyst layer from the supporter, and transferring the protection metal layer and the graphene layer from the supporter to a second substrate.

A size of the protection metal layer may be smaller than a size of the graphene layer.

An outer portion of the graphene layer may be exposed by the protection metal layer.

The attaching of the supporter to the protection metal layer may include bonding the outer portion of the graphene layer to the supporter.

The graphene transfer method may further include removing the outer portion of the graphene layer exposed by the protection metal layer such that a portion of the catalyst layer is exposed, after the forming of the protection metal layer and prior to the attaching of the supporter to the protection metal layer.

The attaching of the supporter to the protection metal layer may include bonding the exposed portion of the catalyst layer to the supporter.

The protection metal layer may include at least one of Au, Cu, Ni, Ti, Fe, Ru, Pd, Al and combinations thereof.

The protection metal layer may be formed of Au, for example.

The forming of the protection metal layer may include performing an evaporation process.

The method may further include providing an insulating layer between the first substrate and the catalyst layer, wherein the separating of the first substrate includes separating the catalyst layer and the insulating layer from each other.

The method may further include providing an insulating layer between the first substrate and the catalyst layer, wherein the separating of the first substrate includes removing at least a portion of the insulating layer.

A size of the supporter may be greater than a size of the first substrate.

The graphene transfer method may further include providing a fixing member configured to attach to an outer portion of the supporter.

The transferring of the protection metal layer and the graphene layer from the supporter to the second substrate may include attaching the second substrate to the graphene layer, and removing the supporter from the protection metal layer.

The attaching of the second substrate to the graphene layer may include providing deionized water between the graphene layer and the second substrate, bonding the graphene layer and the second substrate having the deionized water interposed therebetween, and drying the graphene layer and the second substrate.

At least one of the first substrate and the second substrate may be a wafer level/scale substrate.

According to other example embodiments, a graphene transfer method includes forming a thin film including a graphene layer on a first substrate, forming a protection layer having a size smaller than a size of the graphene layer on the thin film such that a portion of the thin film around the protection layer is exposed, attaching a supporter to the protection layer and the exposed portion of the thin film, separating the first substrate from the thin film such that the protection layer and the thin film remain on the supporter, and transferring the graphene layer from the supporter to a second substrate.

The thin film further may include a catalyst layer provided between the first substrate and the graphene layer.

The attaching of the supporter to the protection layer and the exposed portion of the thin film may include bonding at least one of the graphene layer and the catalyst layer to the supporter.

A size of the supporter may be greater than a size of the first substrate.

According to still other example embodiments, a method of manufacturing a graphene applied device includes transferring the graphene layer and the protection layer (protection metal layer) from the first substrate to the second substrate according to the method, and forming the graphene applied device such that the graphene layer on the second substrate is incorporated into the graphene applied device.

The forming of the graphene applied device may include forming at least one electrode from the protection layer (protection metal layer).

The graphene applied device may include a transistor.

According to further example embodiments, a substrate structure includes a wafer substrate, a graphene layer on the wafer substrate, and a protection metal layer on the graphene layer, wherein a size of the protection metal layer is smaller than a size of the graphene layer, and wherein an outer portion of the graphene layer exposed by the protection metal layer has a ring shape.

The protection metal layer may include at least one of Au, Cu, Ni, Ti, Fe, Ru, Pd, Al and combinations thereof.

A width of the outer portion of the graphene layer exposed by the protection metal layer may be in the range of about several tens μm to about 1 cm.

The size of the graphene layer may be smaller than a size of the wafer substrate, wherein an outer portion of the wafer substrate exposed by the graphene layer has a ring shape.

BRIEF DESCRIPTION OF THE DRAWINGS

Example embodiments will be more clearly understood from the following detailed description taken in conjunction with the accompanying drawings. FIGS. 1A-13E represent non-limiting, example embodiments as described herein.

FIGS. 1A through 1H are cross-sectional views for explaining a graphene transferring method, according to example embodiments;

FIG. 7 is a photo of a structure corresponding to an operation of FIG. 6C formed according to example embodiments;

FIG. 8 is a photo of a structure corresponding to an operation of FIG. 6E formed according to example embodiments;

FIGS. 9 and 10 are scanning electron microscope (SEM) images of surfaces of graphene layers transferred according to a comparative example and example embodiments, respectively;

FIG. 11 is a graph illustrating a result obtained by measuring a Raman spectrum characteristic of the graphene layer of FIG. 10;

FIG. 12 is a graph illustrating a result obtained by measuring electrical resistance of graphene layers transferred according to a comparative example and example embodiments; and FIGS. 13A through 13E are cross-sectional views illustrating a method of manufacturing a graphene applied device by applying a graphene transferring method, according to example embodiments.

DETAILED DESCRIPTION

Figure 1A:
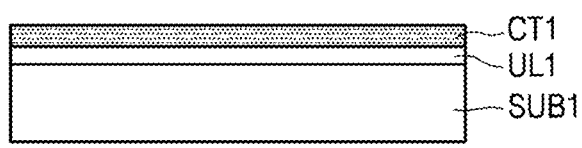

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Hereinafter, graphene transferring methods, device manufacturing methods using the same, and substrate structures including graphene according to example embodiments, will be described in detail with reference to the accompanying drawings. In the drawings, the width and thickness of layers and regions may be exaggerated for clarity. The same reference numerals represent the same elements throughout the drawings. As used herein, the term "and/or" includes any and all combinations of one or more of the associated listed items.

FIGS. 1A through 1H are cross-sectional views for explaining a graphene transferring method, according to example embodiments.

Referring to FIG. 1A, a catalyst layer CT1 may be formed on a first substrate SUB1. A silicon substrate, for example, may be used as the first substrate SUB1. However, a substrate other than the silicon substrate, for example, a sapphire substrate, a SiC substrate, or a quartz substrate, may be used as the first substrate SUB1. The first substrate SUB1 may be a substrate in a wafer level (wafer scale). For example, the first substrate SUB1 may be a wafer having a size (diameter) equal to or greater than 6 inches. Before forming the catalyst layer CT1, a desired (or predetermined) underlayer UL1 may be formed on the first substrate SUB1, and then the catalyst layer CT1 may be formed on the underlayer UL1. The underlayer UL1 may function to prevent a reaction between the first substrate SUB1 and the catalyst layer CT1, for example, a silicide reaction. The underlayer UL1 may function to prevent a material diffusion between the first substrate SUB1 and the catalyst layer CT1. The underlayer UL1 may be formed as an insulating layer, for example, a silicon oxide layer. When the first substrate SUB1 is the silicon substrate, the silicon oxide layer used as the underlayer UL1 may be formed by oxidizing a surface portion (an upper surface portion) of the first substrate SUB1. A thickness of the underlayer UL1 may be in the range of about 100 nm and about 300 nm. A material of the underlayer UL1 and a method of forming the underlayer UL1 are not limited thereto, and may be changed in various ways. For example, the underlayer UL1 may be formed of a nitride and may be formed by using a method other than an oxidation process. According to circumstances, the underlayer UL1 may not be formed.

The catalyst layer CT1 may be formed of at least one of metal such as Ni, Fe, Cu, Co, Pt, and Ru and a mixture thereof. The catalyst layer CT1 may have a monolayer structure or a multilayer structure. The catalyst layer CT1 may be formed using various methods such as plating, evaporation, sputtering, chemical vapor deposition (CVD), and atomic layer deposition (ALD). The catalyst layer CT1 may have a thickness in the range of about 100 nm and about 500 nm.

Figure 1B:
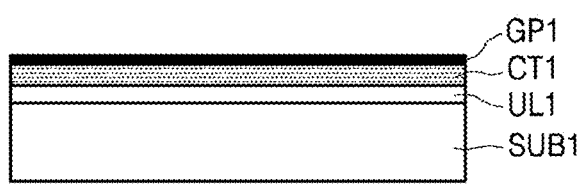

Referring to FIG. 1B, a graphene layer GP1 may be formed on the catalyst layer CT1. The graphene layer GP1 may be formed by using CVD or pyrolysis. When the graphene layer GP1 is formed by using CVD, source gas containing carbon may be flowed on the catalyst layer CT1. As the source gas, for example, $CH_4$, $C_2H_2$, $C_2H_4$, and CO may be used. The graphene layer GP1 may include graphene of about 1 to about 10 layers (or about 1 to about 5 layers). That is, the graphene layer GP1 may be formed of single graphene or may have a structure in which a plurality of graphene layers smaller than or equal to about 10 layers (or about 5 layers) are stacked. Even when graphene of few layers smaller than or equal to about 10 layers is stacked, intrinsic property of graphene may be maintained. In FIG. 1B, a stack structure of the catalyst layer CT1 and the graphene layer GP1, or a stack structure of the underlayer UL1, the catalyst layer CT1, and the graphene layer GP1, may be a "thin film structure".

Figure 1C:
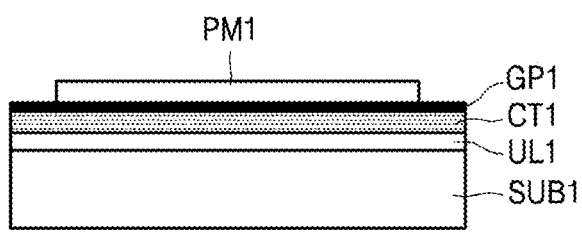

Referring to FIG. 1C, a protection metal layer PM1 may be formed on the graphene layer GP1. A size (in a horizontal direction) of the protection metal layer PM1 may be smaller than that of the graphene layer GP1. After an outer portion (an edge portion) of the graphene layer GP1 is masked by using a desired (or predetermined) shadow mask (not shown), the protection metal layer PM1 may be formed and then the shadow mask may be removed. Alternatively, after a metal layer is formed on an entire upper surface of the graphene layer GP1, the protection metal layer PM1 may be formed by etching an outer portion (an edge portion) of the metal layer. In this way, when the protection metal layer PM1 is formed to be smaller than the graphene layer GP1, the outer portion (an edge portion) of the graphene layer GP1 may not be covered by the protection metal layer PM1 and may be exposed. A width of the outer portion (an edge portion) of the graphene layer GP1 that is not covered by the protection metal layer PM1 may be, for example, in the range of about several tens μm and about 1 cm.

The protection metal layer PM1 may function to protect the graphene layer GP1 during a graphene transferring process. The protection metal layer PM1 may be formed of Au, Cu, Ni, Ti, Fe, Ru, Pd, Al, or the like. In particular, unlike an organic substance (epoxy resin, etc.) containing carbon, Au may be an optimal material for protecting graphene. After the graphene layer GP1 is transferred, the protection metal layer PM1 formed of Au may be used as an electrode when a graphene device is manufactured.

The protection metal layer PM1 may be formed by using evaporation. If the protection metal layer PM1 is formed by using evaporation, damage of the graphene layer GP1 may be prevented (inhibited) when the protection metal layer PM1 is formed. However, a method of forming the protection metal layer PM1 is not limited to evaporation and may be modified in various ways. For example, the protection metal layer PM1 may be formed by using other methods such as ALD, CVD, and sputtering. Meanwhile, a thickness of the protection metal layer PM1 may be in the range of about several nm and about several hundreds nm.

The protection metal layer PM1 is formed in a status where a surface of the graphene layer GP1 is clean, and thus a contact characteristic between the graphene layer GP1 and the protection metal layer PM1 may be excellent. For example, a contact resistance between the graphene layer GP1 and the protection metal layer PM1 may be very low. A related method forms a polymer layer (PMMA, etc.) on a graphene layer, transfers the graphene layer to a substrate, removes the polymer layer, and forms an electrode contacting the graphene layer. Thus, in the related method, a contact characteristic between the graphene layer and the electrode may deteriorate due to residue of the polymer layer. However, in the present example embodiments, the protection metal layer PM1 is formed on a clean surface of the graphene layer GP1, and thus an excellent contact characteristic therebetween may be obtained. During and after the graphene transfer process, the graphene layer GP1 may be easily protected by using the protection metal layer PM1. Furthermore, after graphene is transferred, when the graphene device is manufactured, if the protection metal layer PM1 is used as the electrode, a process of manufacturing the graphene device may be simplified, and the graphene device having an excellent characteristic may be manufactured.

Figure 1D:
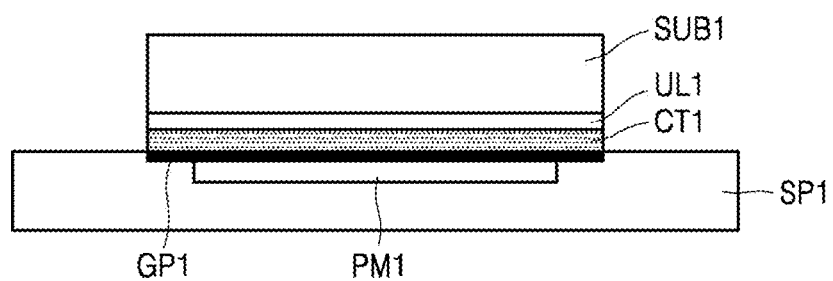

Referring to FIG. 1D, a supporter SP1 may be attached to the protection metal layer PM1. The supporter SP1 may be, for example, an adhesive tape. The adhesive tape may be a thermal release type of which adhesion is weak due to heat or an UV release type of which adhesion is weak due to ultraviolet (UV) ray. Alternatively, the supporter SP1 may be a removable tape by a desired (or predetermined) solvent, for example, a water-soluble tape. Alternatively, the supporter SP1 may be an epoxy resin such as polycarbonate or a dry film capable of being patterned. Alternatively, the supporter SP1 may be formed by mixing two or more materials of the above-described materials. In addition, the constitution (composition) of the supporter SP1 may be modified in various ways.

A size of the supporter SP1 may be greater than that of the first substrate SUB1. In other words, the supporter SP1 may have a structure extending around (in all directions) of the first substrate SUB1. As described above, the supporter SP1 having a size greater than that of the first substrate SUB1, thereby inhibiting (preventing) the graphene layer GP1 from being damaged during a subsequent graphene transferring process. In more detail, when the supporter SP1 has a large size, because a shape of the supporter SP1 may be inhibited from being modified due to stress, problems of exfoliation and damage of the graphene layer GP1 may be prevented and minimized. Also, a peripheral portion of the supporter SP1 may be easily fixed, and thus subsequent processes may be performed in a state where the supporter SP1 is stably fixed. Therefore, the problems of exfoliation and damage of the graphene layer GP1 may be inhibited and prevented.

In an operation of attaching the supporter SP1 to the protection metal layer PM1, the supporter SP1 may be bonded to the outer portion (the edge portion) of the graphene layer GP1. That is, the exposed outer portion of the graphene layer GP1 that is not covered by the protection metal layer PM1 may be bonded to the supporter SP1. Adhesion between the supporter SP1 and the graphene layer GP1 may be stronger than that between the supporter SP1 and the protection metal layer PM1. Accordingly, the outer portion of the graphene layer GP1 is bonded to the supporter SP1, and thus the catalyst layer CT1, the graphene layer GP1, and the protection metal layer PM1 formed on the first substrate SUB1 may be more strongly bonded and fixed to the supporter SP1.

Although the supporter SP1 is disposed undermost and the first substrate SUB1 is disposed above the supporter SP1 in FIG. 1D, the location relationship therebetween may be switched. That is, a structure of FIG. 1D may be reversed up and down. In other words, in a state where the first substrate SUB1 is disposed as shown in FIG. 1C, the supporter SP1 may be attached to the protection metal layer PM1 above the first substrate SUB1. Although not shown, in a state where a set (or predetermined) fixing member is provided in an extension portion (an outer portion) of the supporter SP1, an attachment process as shown in FIG. 1D may be performed. When the fixing member is provided, a modification of the supporter SP1 may be further prevented (inhibited). The case of using the fixing member will be described with reference to FIGS. 6A through 6E later.

Figure 1E:
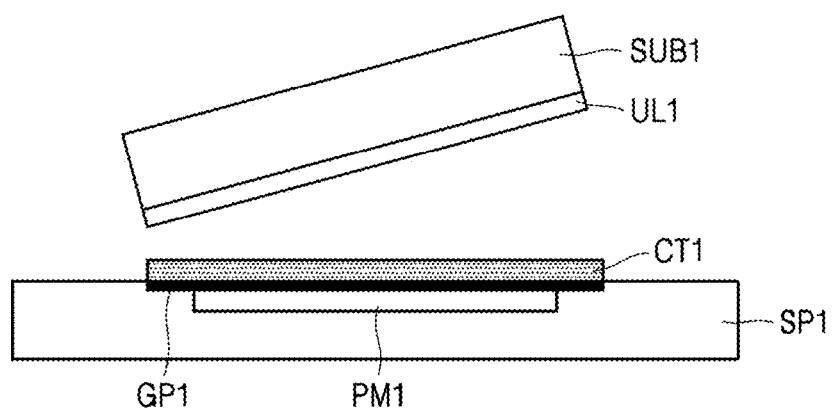

Referring to FIG. 1E, the first substrate SUB1 may be separated from the protection metal layer PM1, the graphene layer GP1, and the catalyst layer CT1 that are attached to the supporter SP1. The operation of separating the first substrate SUB1 may include an operation of separating the underlayer UL1 and the catalyst layer CT1 from each other. That is, the first substrate SUB1 may be separated by separating the underlayer UL1 and the catalyst layer CT1 from each other. Adhesion force between the underlayer UL1 and the catalyst layer CT1 may be weaker than adhesion force including first adhesion force between the supporter SP1 and the protection metal layer PM1 and second adhesion force between the supporter SP1 and the graphene layer GP1. The adhesion force between the underlayer UL1 and the catalyst layer CT1 may be weaker than that between the graphene layer GP1 and the catalyst layer CT1. Thus, the underlayer UL1 and the catalyst layer CT1 may be separated from each other by using a physical method. However, in addition to the physical method, another method, for example, an electrochemical method or a method of selectively etching the underlayer UL1, may be used to separate the first substrate SUB1. When the underlayer UL1 is etched, for example, an etching solution containing HF may be used.

Figure 1F:
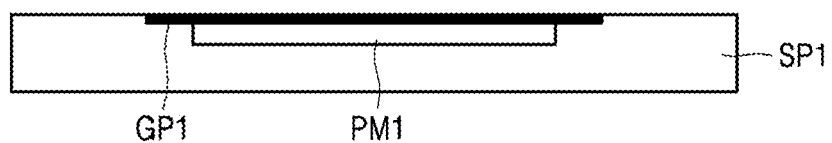

Thereafter, the catalyst layer CT1 may be removed. A metal etchant such as $FeCl_3$ or $HNO_3$ may be used to etch the catalyst layer CT1. A resultant obtained by removing the catalyst layer CT1 is shown in FIG. 1F. A structure of FIG. 1F may be a structure in which the protection metal layer PM1 and the graphene layer GP1 are attached to the supporter SP1.

Figure 1G:
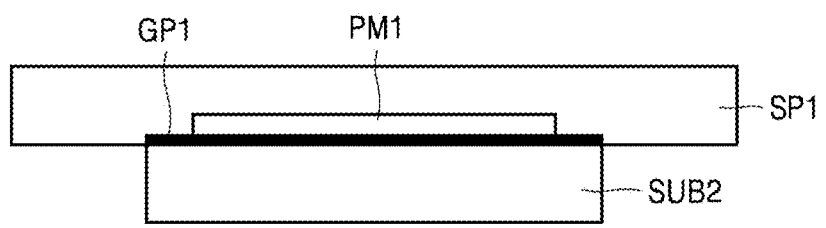

Referring to FIG. 1G, a second substrate SUB2 may be attached to the graphene layer GP1. The second substrate SUB2 may be a wafer level/scale substrate. For example, the second substrate SUB2 may be a wafer having a size (diameter) greater than 6 inches. Although the second substrate SUB2 may be a silicon substrate, a material thereof may be changed in various ways. That is, the second substrate SUB2 may be one of various substrates used in a semiconductor device. A desired (or predetermined) insulating layer (not shown) may be further provided on the second substrate SUB2. In this case, the graphene layer GP1 may be attached to the insulating layer. Thus, the insulating layer may be disposed between the second substrate SUB2 and the graphene layer GP1. When the second substrate SUB2 is the silicon substrate, the insulating layer may be a silicon oxide layer or a silicon nitride layer. A non-insulating layer (not shown) may be disposed between the second substrate SUB2 and the graphene layer GP1 instead of or in addition to the insulating layer. Although not shown, a desired (or predetermined) adhesion layer may be disposed between the second substrate SUB2 and the graphene layer GP1.

The operation of attaching the second substrate SUB2 and the graphene layer GP1 to each other may include, for example, operations of providing deionized water (not shown) between the graphene layer GP1 and the second substrate SUB2, bonding the graphene layer GP1 and the second substrate SUB2 with an interposition of the deionized water, and drying the graphene layer GP1 and the second substrate SUB2. When the deionized water is dry, hydroxyl radical (OH) may remain on an interface between the graphene layer GP1 and the second substrate SUB2, and thus adhesion therebetween may be reinforced and maintained. That is, in the present example embodiments, the deionized water may be used as an adhesion member to attach the graphene layer GP1 and the second substrate SUB2 to each other. However, this method is merely exemplary, and may be changed in various ways.

Thereafter, the supporter SP1 may be separated/removed from a structure of FIG. 1G. For example, when the supporter SP1 is a thermal release type adhesion tape, the supporter SP1 may be separated/removed by applying heat. According to a type of the supporter SP1, a method of separating/removing the supporter SP1 may be changed in various ways. A resultant structure obtained by separating/removing the supporter SP1 is shown in FIG. 1H.

Figure 1H:
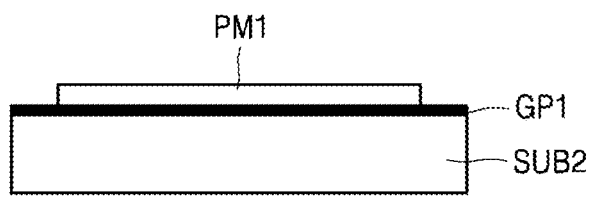

Referring to FIG. 1H, the graphene layer GP1 may be provided on the second substrate SUB2, and the protection metal layer PM1 may be provided on the graphene layer GP1. A size of the protection metal layer PM1 may be smaller than that of the graphene layer GP1. An outer portion (an edge portion) of the graphene layer GP1 may not be covered by the protection metal layer PM1 but may be exposed. The second substrate SUB2 may be a wafer level/scale substrate (i.e., a wafer substrate). The outer portion (the edge portion) of the graphene layer GP1 that is not covered by the protection metal layer PM1 may have a ring shape. In this regard, a width of the outer portion (the edge portion) of the graphene layer GP1 that is not covered by the protection metal layer PM1 may be in the range of, for example, about several tens μm and about 1 cm.

According to other example embodiments, after etching the graphene layer GP1 around the protection metal layer PM1 in the operation of FIG. 1C, a subsequent process may be performed. These example embodiments will now be described with reference to FIGS. 2A through 2C.

Figure 2A:
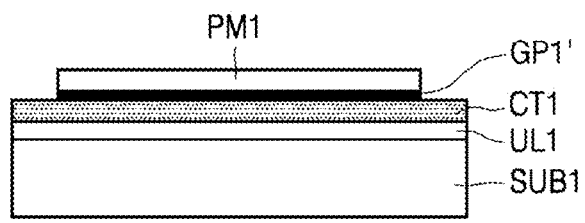
FIGS. 2A through 2C are cross-sectional views for explaining a graphene transferring method, according to example embodiments.

Referring to FIG. 2A, an outer portion (an edge portion) of the catalyst layer CT1 may be exposed by etching a portion of the graphene layer GP1 around the protection metal layer PM1 of FIG. 1C. GP1' denotes a graphene layer of which outer portion (edge portion) is etched.

Figure 2B:
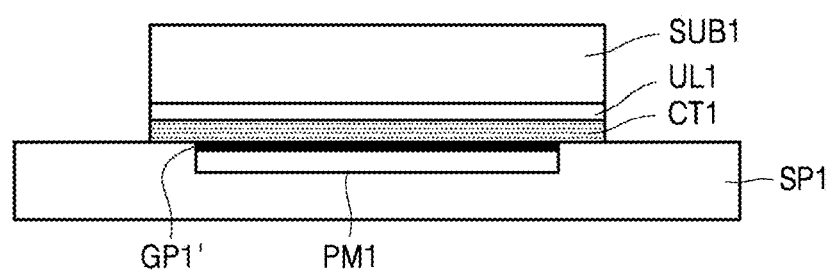

Referring to FIG. 2B, the supporter SP1 may be attached to the protection metal layer PM1. In this regard, the outer portion (the edge portion) of the catalyst layer CT1 may be bonded to the supporter SP1. Adhesion force between the catalyst layer CT1 and the supporter SP1 may be stronger than that between the graphene layer GP1 and the supporter SP1 of FIG. 1D. Thus, adhesion force between the protection metal layer PM1, the graphene layer GP1', the catalyst layer CT1, and the supporter SP1 of FIG. 2B may be stronger than that between the protection metal layer PM1, the graphene layer GP1, and the supporter SP1 of FIG. 1D.

Figure 2C:
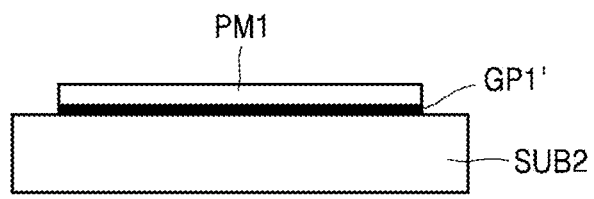

Thereafter, through the similar process of FIGS. 1E through 1H, a substrate structure as shown in FIG. 2C may be obtained.

Referring to FIG. 2C, the graphene layer GP1' may be provided on the second substrate SUB2, and the protection metal layer PM1 may be provided on the graphene layer GP1'. In this regard, the graphene layer GP1' and the protection metal layer PM1 may have the same or almost similar size. The graphene layer GP1' and the protection metal layer PM1 may have sizes smaller than the second substrate SUB2. Thus, an outer portion (edge portion) of the second substrate SUB2 may not be covered by the graphene layer GP1' and the protection metal layer PM1 but may be exposed.

According to further example embodiments, after removing a portion of the underlayer UL1 in the operation of FIG. 1D, a subsequent process may be performed. These example embodiments will now be described with reference to FIGS. 3A and 3B.

Figure 3A:
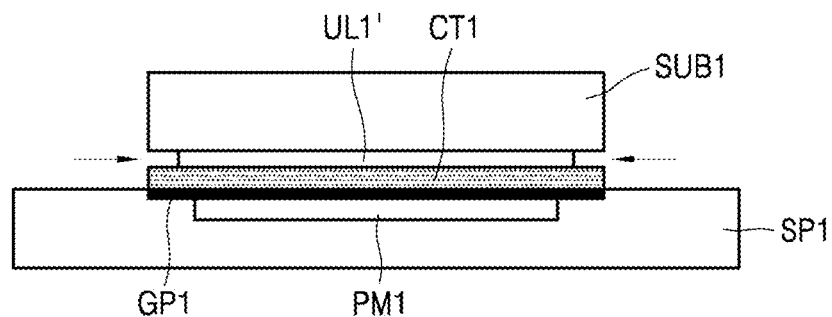
FIGS. 3A and 3B are cross-sectional views for explaining a graphene transferring method, according to example embodiments.

Referring to FIG. 3A, a portion of an outer portion (edge portion) of the underlayer UL1 may be removed (etched) from the structure of FIG. 1D. When the underlayer UL1 is a silicon oxide layer, a buffered oxide etchant (BOE) or an HF solution may be used to selectively etch the portion of the outer portion (edge portion) of the underlayer UL1. UL1' denotes an underlayer having the etched outer portion (edge portion). A groove may be formed in around the underlayer UL1' between the first substrate SUB1 and the catalyst layer CT1.

Figure 3B:
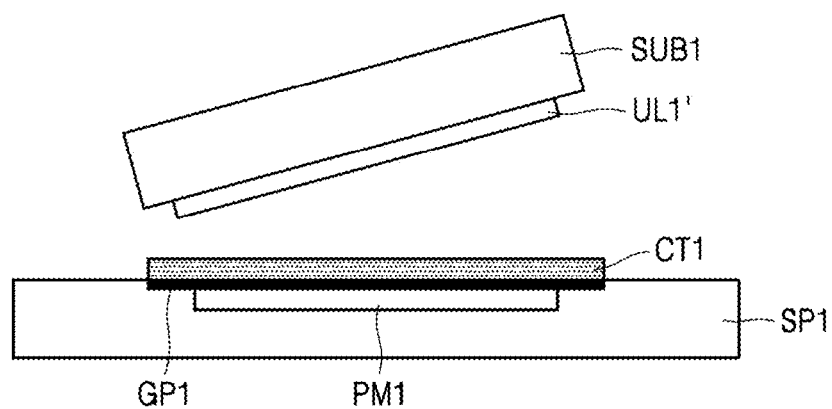

Thereafter, referring to FIG. 3B, the first substrate SUB1 may be separated by separating an interface between the underlayer UL1' and the catalyst layer CT1. As described above, if the first substrate SUB1 is separated in a state where the groove is formed in around the underlayer UL1' (FIG. 3A), the first substrate SUB1 may be more easily separated. Thereafter, although not shown, subsequent processes similar to those of FIGS. 1F through 1H may be performed.

According to yet further example embodiments, the supporter SP1 may cover a side surface of the catalyst layer CT1 in the operation of FIG. 1D. These example embodiments will now be described with reference to FIGS. 4A and 4B.

Figure 4A:
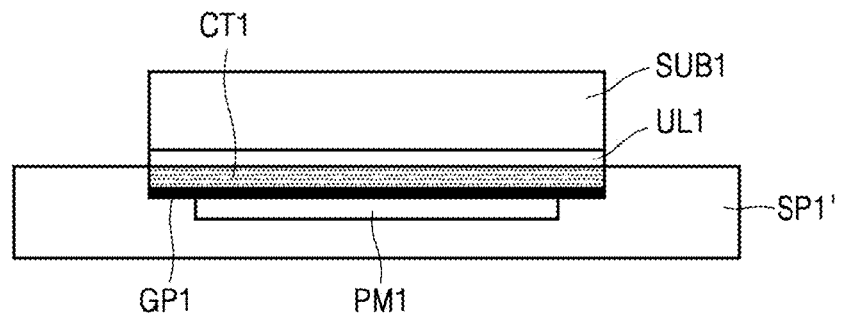
FIGS. 4A and 4B are cross-sectional views for explaining a graphene transferring method, according to example embodiments.

Referring to FIG. 4A, in an operation of attaching the protection metal layer PM1 to the supporter SP1', at least a part of the side surface of the catalyst layer CT1 may be bonded to the supporter SP1'.

Figure 4B:
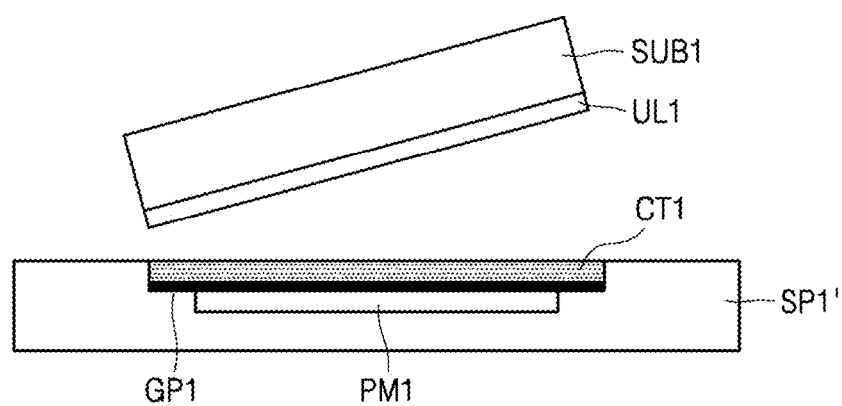

Referring to FIG. 4B, the first substrate SUB1 may be separated from the catalyst layer CT1. If the first substrate SUB1 is separated in a state where the supporter SP1' is bonded to the side surface of the catalyst layer CT1, the first substrate SUB1 may be more easily separated. Thereafter, although not shown, subsequent processes similar to those of FIGS. 1F through 1H may be performed.

According to still other example embodiments, the catalyst layer CT1 may be somewhat smaller than the first substrate SUB1 in the operation of FIG. 1A. In this case, a size of the graphene layer GP1 formed on the catalyst later CT1 may be smaller than that of the first substrate SUB1. These example embodiments will now be described with reference to FIGS. 5A through 5C.

Figure 5A:
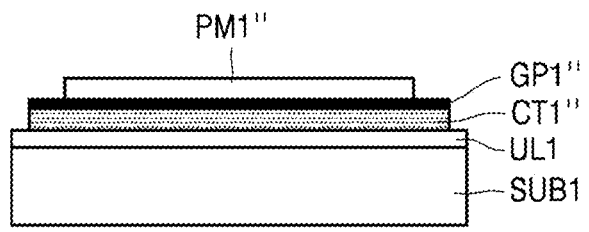
FIGS. 5A through 5C are cross-sectional views for explaining a graphene transferring method, according to example embodiments.

Referring to FIG. 5A, the underlayer UL1 may be formed on the first substrate SUB1, and a catalyst layer CT1" may be formed on the underlayer UL1. A size of the catalyst layer CT1" may be somewhat smaller than those of the first substrate SUB1 and the underlayer UL1. Thus, an edge portion of the underlayer UL1 may not be covered by the catalyst layer CT1".

Thereafter, a graphene layer GP1" may be formed on the catalyst layer CT1". The graphene layer GP1" may have the same size (in a horizontal direction) as the catalyst layer CT1". A protection metal layer PM1" having a size smaller than that of the graphene layer GP1" may be formed on the graphene layer GP1". Although a structure of FIG. 5A is similar to the structure of FIG. 1C, the structures are different in terms of sizes of the catalyst layer CT1" and the graphene layer GP1".

Figure 5B:
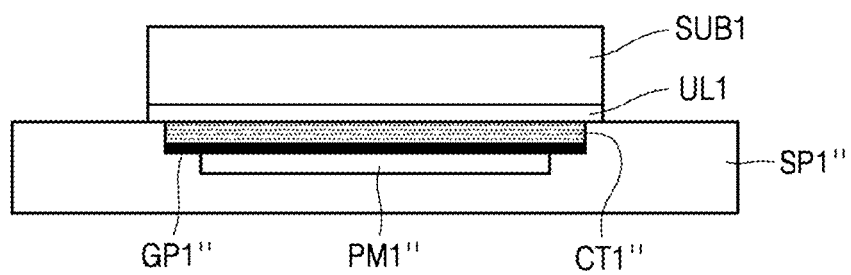

Referring to FIG. 5B, a supporter SP1" may be attached to the protection metal layer PM1". The supporter SP1" may be bonded to an exposed surface of the graphene layer GP1". The supporter SP1" may cover even at least a part of a side surface of the catalyst layer CT1".

Figure 5C:
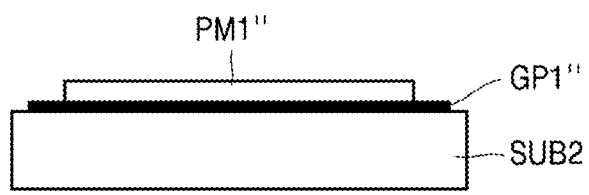

Thereafter, if subsequent processes similar to those of FIGS. 1E through 1H are performed, a substrate structure of FIG. 5C may be obtained.

Referring to FIG. 5C, the graphene layer GP1 "may be provided on the second substrate SUB2, and the protection metal layer PM1" may be provided on the graphene layer GP1 ". In this regard, the graphene layer GP1" may be somewhat smaller than that of the second substrate SUB2. Thus, an edge portion of the second substrate SUB2 may not be covered by the graphene layer GP1 "but may be exposed. The edge portion of the second substrate SUB2 that is not covered by the graphene layer GP1" may have a ring shape when seen above. A size of the protection metal layer PM1 "may be smaller than that of the graphene layer GP1". An outer portion (edge portion) of the graphene layer GP1" that is not covered by the protection metal layer PM1 "may have a ring shape when seen above. Although a structure of FIG. 5C is similar to the structure of FIG. 1H, the structures are different in that a size of the graphene layer GP1" is somewhat smaller than that of the second substrate SUB2.

FIGS. 6A through 6E are cross-sectional views for explaining a graphene transferring method, according to example embodiments.

In the present example embodiments, graphene is transferred in a state where a fixing member is provided in an extension portion (outer/edge portion) of the supporter (SP1 of FIG. 1D).

Figure 6A:
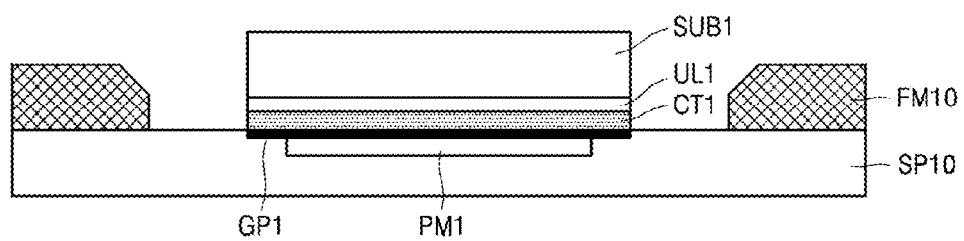
FIGS. 6A through 6E are cross-sectional views for explaining a graphene transferring method, according to example embodiments.

Referring to FIG. 6A, a fixing member FM10 may be provided in an extension portion (outer/edge portion) of a supporter SP10. For example, the fixing member FM10 may be a ring formed of stainless steel or a Teflon-coated ring. As described above, in a state where the supporter SP10 is fixed by using the fixing member FM10, the protection metal layer PM1 of the first substrate SUB1 may be attached to the supporter SP10. The operation of FIG. 6A may be similar to the operation of FIG. 1D.

Figure 6B:
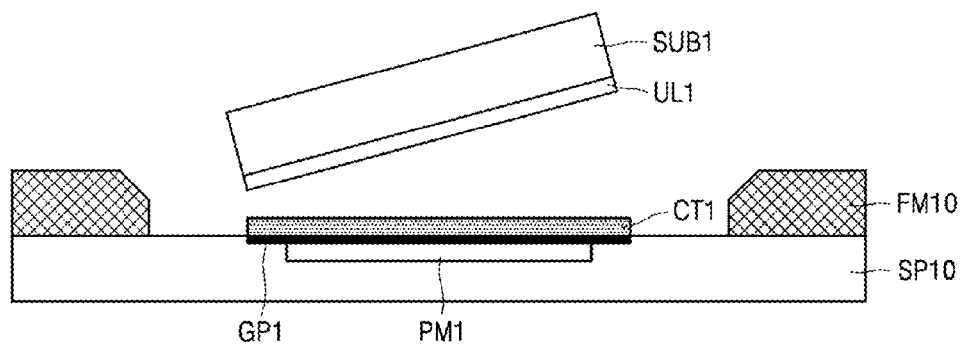

Referring to FIG. 6B, the first substrate SUB1 may be separated from the supporter SP10. That is, the protection metal layer PM1, the graphene layer GP1, and the catalyst layer CT1 that are attached to the supporter SP10 may be separated from the first substrate SUB1. In the present example embodiments, the supporter SP10 is fixed by using the fixing member FM10, and thus the supporter SP10 may be prevented from being modified in the operation of separating the first substrate SUB1, and the graphene layer GP1 may be prevented (inhibited) from being damage or exfoliated. The operation of FIG. 6B may be similar to the operation of FIG. 1E.

Figure 6C:
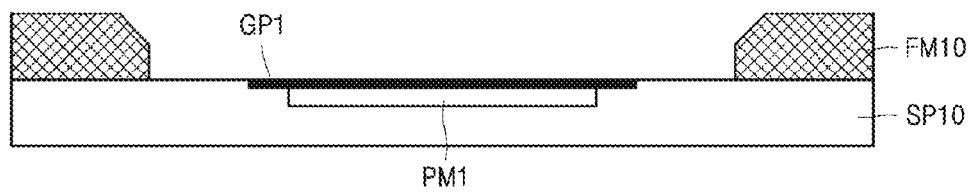

Referring to FIG. 6C, the catalyst layer CT1 formed on the graphene layer GP1 may be removed. The operation of FIG. 6C may be similar to the operation of FIG. 1F.

Figure 6D:
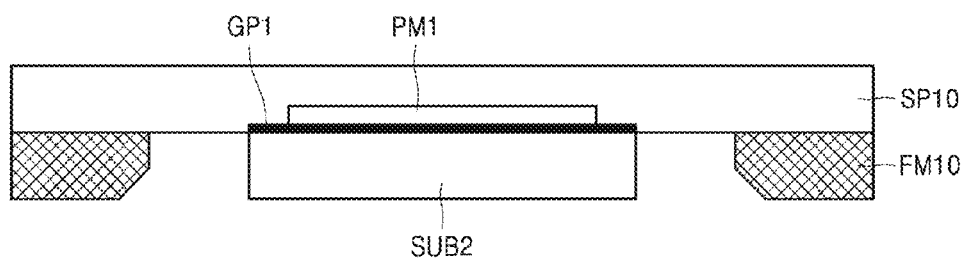

Referring to FIG. 6D, the graphene layer GP1 of the supporter SP10 may be attached to the second substrate SUB2. The operation of FIG. 6D may be similar to the operation of FIG. 1G.

Figure 6E:
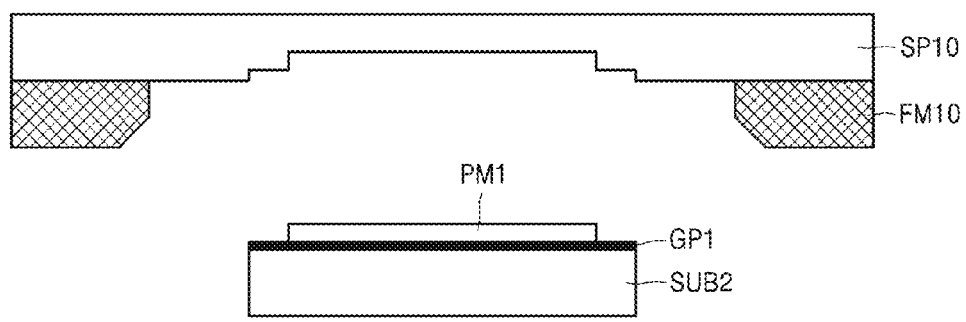

Referring to FIG. 6E, the supporter SP10 may be separated/removed from the graphene layer GP1 and the protection metal layer PM1 that are attached to the second substrate SUB2. As a result, a substrate structure (SUB2+GP1+PM1) as described with reference to FIG. 1H may be obtained. A method of separating/removing the supporter SP10 may be the same as or similar to described with reference to FIGS. 1G and 1H.

The substrate structure including graphene shown in FIGS. 1H, 2C, 5C, and 6E may include the graphene layer GP1, GP1' or GP1" and the protection metal layer PM1 or PM1" that are provided on the second substrate SUB2. The graphene layers GP1, GP1', and GP1" may be protected by the protection metal layers PM1 and PM1" for a long time. Thus, the graphene layers GP1, GP1', and GP1" of the substrate structure may be maintained good status. Meanwhile, outer portions of the graphene layers GP1, GP1', and GP1" that are not covered by the protection metal layers PM1 and PM1" may be dummy portions that are not actually used in a device.

Figure 7:
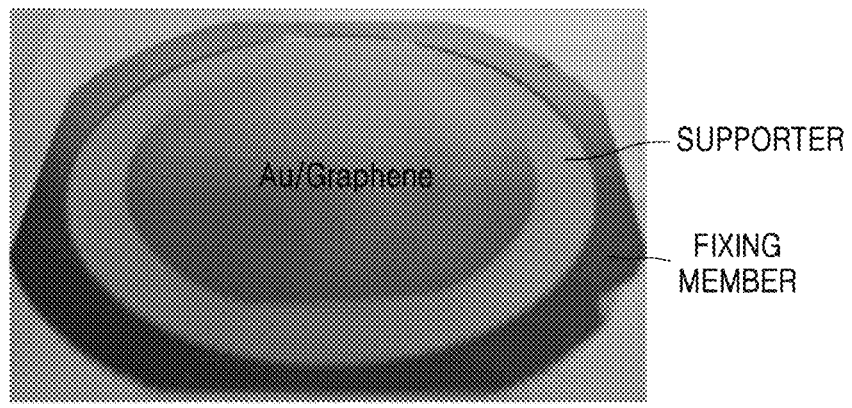

FIG. 7 is a photo of a structure corresponding to an operation of FIG. 6C formed according to example embodiments.

Referring to FIG. 7, a protection metal layer (Au) and a graphene layer are attached to a supporter, and a fixing member is provided (attached) in an outer portion (edge portion) of the supporter. The graphene layer is provided on the protection metal layer (Au).

Figure 8:
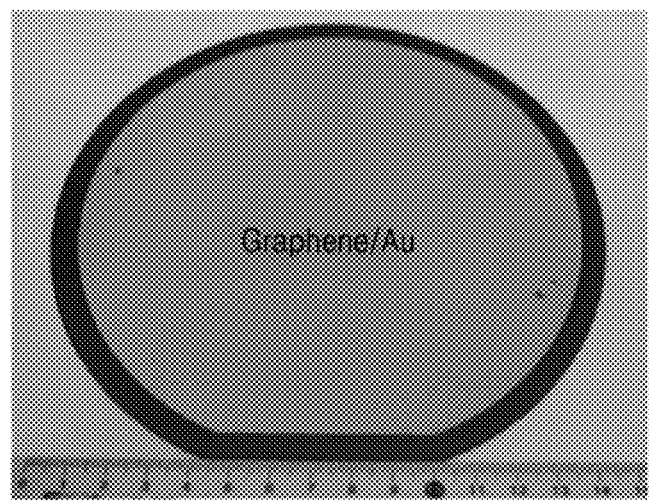

FIG. 8 is a photo of a structure (SUB2+GP1+PM1) corresponding to an operation of FIG. 6E formed according to example embodiments.

Referring to FIG. 8, a graphene layer and a protection metal layer (Au) are sequentially provided on a second substrate (wafer). Because the graphene layer has a transparent or relatively transparent characteristic, although a boundary of the graphene layer is not clearly determined, a size of the graphene layer is greater than that of the protection metal layer (Au). That is, the protection metal layer (Au) having a size somewhat smaller than that of the graphene layer is provided on the graphene layer. The photo of FIG. 8 shows that the graphene layer and the protection metal layer (Au) may be transferred without damage in a wafer level/scale according to example embodiments.

Figure 9:
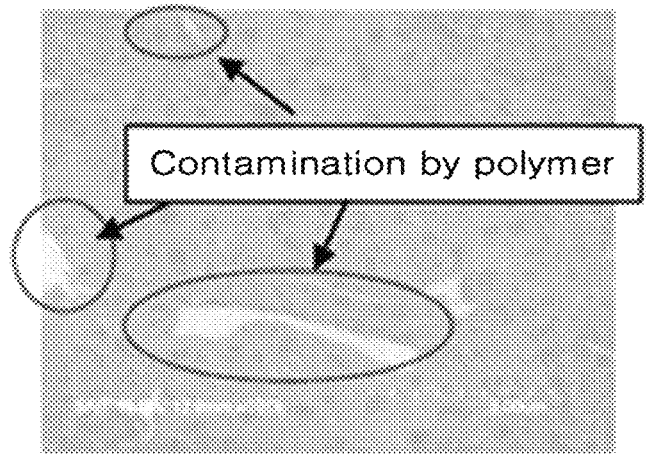
Figure 10:
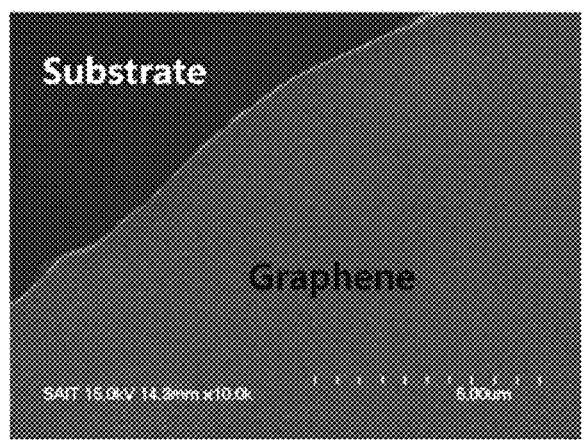

FIGS. 9 and 10 are scanning electron microscope (SEM) images of surfaces of graphene layers transferred according to a comparative example and example embodiments, respectively.

FIG. 9 is the SEM image of a surface of a graphene layer transferred by using a related transfer method (the comparative example) using a polymer layer PMMA. FIG. 10 is the SEM image of a surface of a graphene layer transferred according to the example embodiments shown in FIGS. 1A through 1H. That is, FIG. 10 is the SEM image of the surface of the graphene layer GP1 after the protection metal layer PM1 is removed from the structure of FIG. 1H.

Referring to FIG. 9, a great quantity of polymer impurities (residues) are present on the graphene layer according to the comparative example. Meanwhile, referring to FIG. 10, the graphene layer transferred according to example embodiments has a clean surface. This result shows that, according to example embodiments, the graphene layer may be prevented (inhibited) from being polluted.

Figure 11:
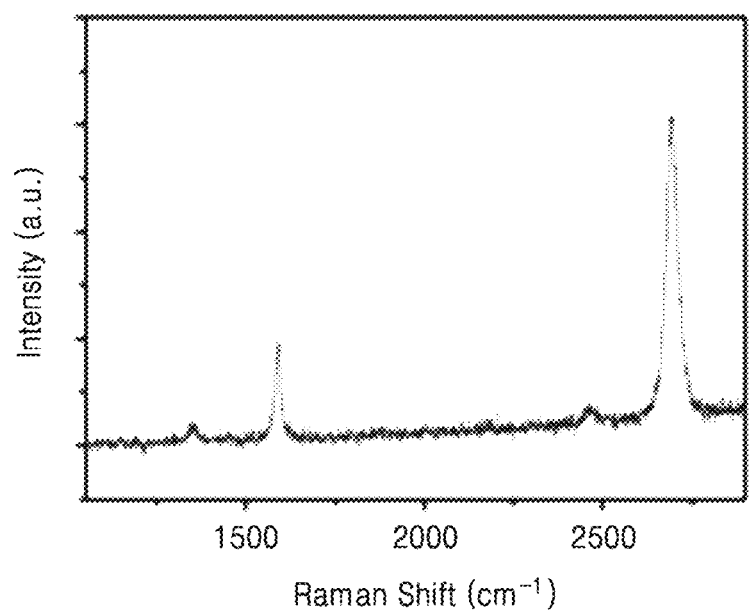

FIG. 11 is a graph illustrating a result obtained by measuring a Raman spectrum characteristic of the graphene layer of FIG. 10.

Referring to FIG. 11, the graph shows an intrinsic Raman spectrum characteristic of graphene. Thus, the graphene layer transferred according to example embodiments maintains the intrinsic characteristic of graphene.

Figure 12:
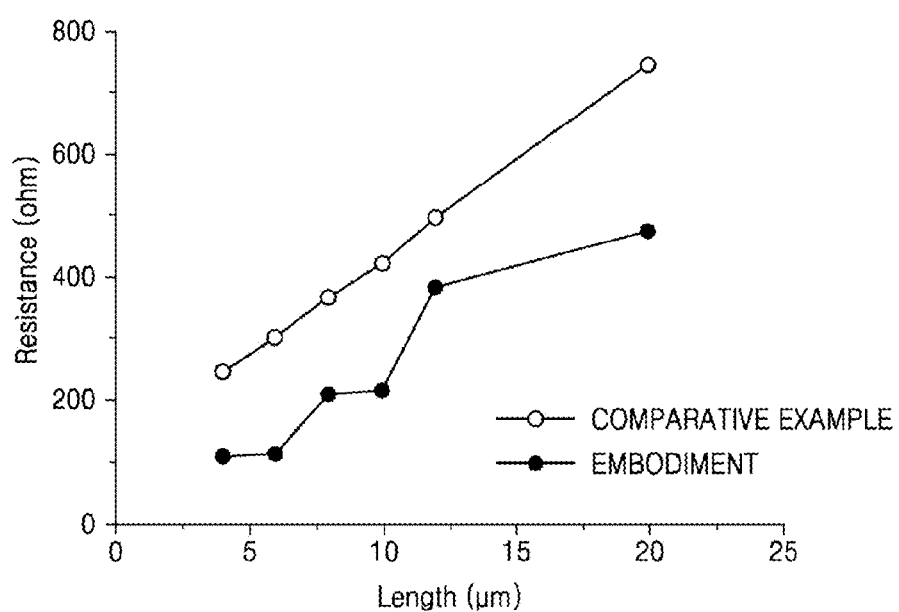

FIG. 12 is a graph illustrating a result obtained by measuring electrical resistance of graphene layers transferred according to a comparative example and example embodiments.

In FIG. 12, an X axis indicates an interval between two electrodes when the electrical resistance of the graphene layer is measured. The comparative example and the example embodiments of FIG. 12 are the same as the comparative example and the example embodiments described with reference to FIGS. 9 and 10, respectively.

Referring to FIG. 12, the electrical resistance of the graphene layer according to example embodiments is quite lower than that of the graphene layer according to the comparative example. This result shows that the graphene layer according to example embodiments exhibits better electrical and physical characteristics than those of the graphene layer according to the comparative example.

FIGS. 13A through 13E are cross-sectional views illustrating a method of manufacturing a graphene applied device by applying a graphene transferring method, according to example embodiments.

Figure 13A:
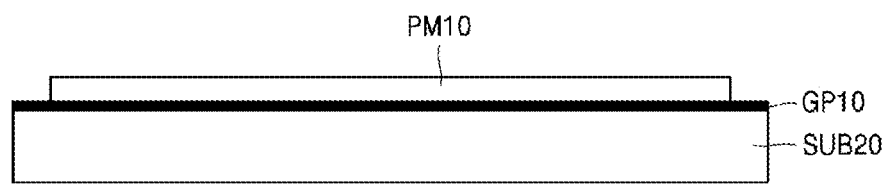

Referring to FIG. 13A, the method of FIGS. 1A through 1H or various modifications thereof may be used to provide a substrate structure that is the same as (or similar to) the substrate structure of FIG. 1H. The substrate structure of FIG. 13A may include a second substrate SUB20, a graphene layer GP10, and a protection metal layer PM10. The second substrate SUB20, the graphene layer GP10, and the protection metal layer PM10 of FIG. 13A may correspond to the second substrate SUB2, the graphene layer GP1, and the protection metal layer PM1 of FIG. 1H, respectively. A size of the protection metal layer PM10 may be smaller than that of the graphene layer GP10.

Figure 13B:
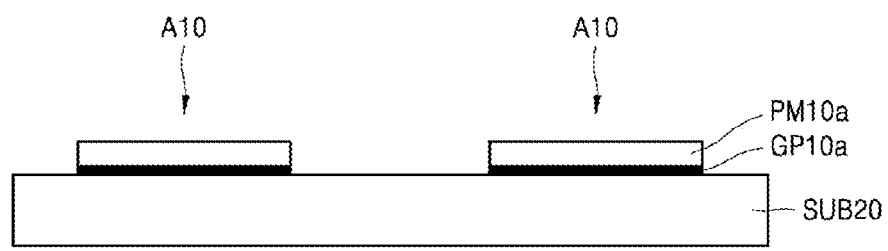

Referring to FIG. 13B, at least one active region A10 may be defined by patterning the graphene layer GP10 and the protection metal layer PM10. In this regard, although two active regions A10 are formed, a greater number of active regions A10 than 2 may be actually formed. The active regions A10 may include a patterned graphene layer GP10a and a patterned protection metal layer PM10a.

Figure 13C:
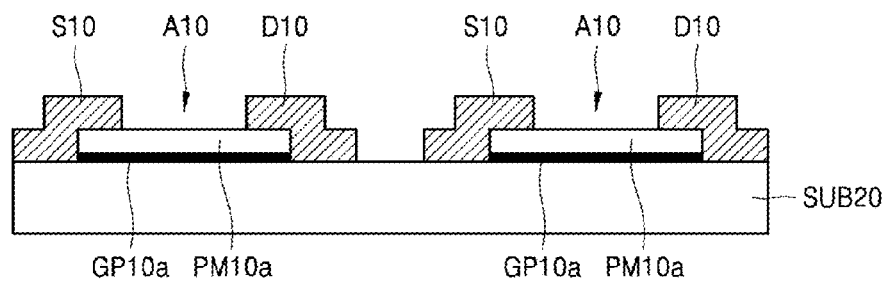

Referring to FIG. 13C, a source electrode S10 and a drain electrode D10 that contact both ends of the active regions A10 may be formed. The source electrode S10 and the drain electrode D10 may be formed of a conductive material such as metal or a metal compound. The source electrode S10 and the drain electrode D10 may be a first pad electrode and a second pad electrode, respectively.

Figure 13D:
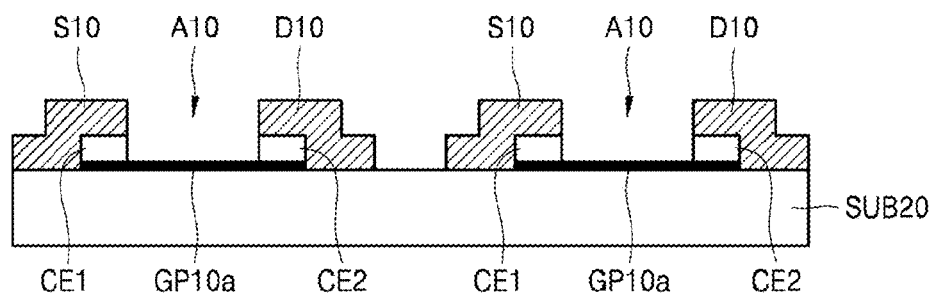

Referring to FIG. 13D, the protection metal layer PM10a between the source electrode S10 and the drain electrode D10 may be etched and removed from the active regions A10. As a result, a first contact electrode CE1 may be formed between the graphene layer GP10a and the source electrode S10, and a second contact electrode CE1 may be formed between the protection metal layer PM10a and the drain electrode D10. The first and second contact electrodes CE1 and CE2 are formed from the protection metal layer PM10a, may be spaced apart from each other, and the graphene layer GP10a therebetween may be exposed. The first and second contact electrodes CE1 and CE2 may be ohmic electrodes. The first and second contact electrodes CE1 and CE2 and the graphene layer GP10a have excellent contact characteristics, and thus contact characteristics between the graphene layer GP10 and the source and drain electrodes S10 and D10 may be improved by the first and second contact electrodes CE1 and CE2. The first contact electrode CE1 may be regarded as a portion of the source electrode S10. Similarly to this, the second contact electrode CE2 may be regarded as a portion of the drain electrode D10.

Figure 13E:
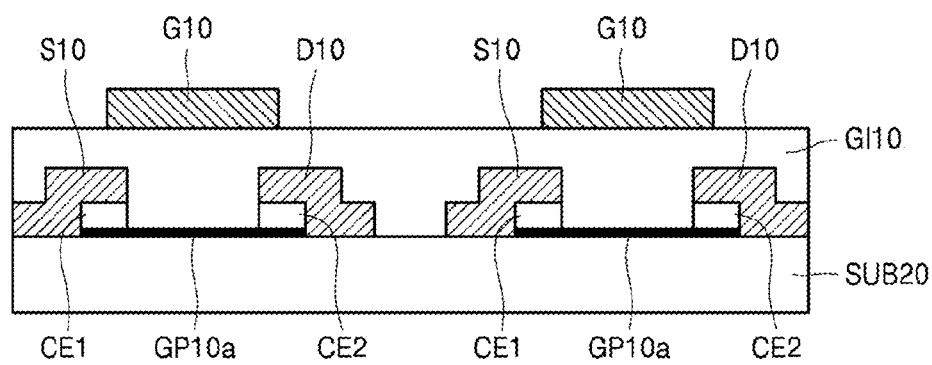

Referring to FIG. 13E, a gate insulating layer GI10 that covers the source and drain electrodes S10 and D10 and the graphene layer GP10a may be formed. A gate electrode G10 may be formed on the gate insulating layer GI10. The gate electrode G10 may be formed at a location corresponding to the graphene layer GP10a. The graphene layer GP10a, the first and second contact electrodes CE1 and CE2, the source and drain electrodes S10 and D10, the gate insulating layer GI10, and the gate electrode G10 may constitute one transistor. The graphene layer GP10a may be used as a channel layer of the transistor.

As described above, according to example embodiments, a protection metal layer formed to protect a graphene layer during a graphene transfer process may be used as an electrode of a graphene device. In this case, the protection metal layer may be used as a contact electrode for improving a contact characteristic between the graphene layer and a pad electrode. Thus, according to example embodiments, a characteristic of the graphene device may be improved.

Although the graphene applied device is a transistor in FIGS. 13A through 13E, a type of the graphene applied device may be changed in various ways. Regardless of types of devices, the graphene transfer method according to example embodiments may be used to manufacture the device to which graphene is applied. In this regard, a transferred graphene layer may be used for various applications, such as a channel layer, a photo-active layer, and an electrode (transparent electrode) of the device. The graphene applied device may be applied to various electronic devices and/or semiconductor apparatuses such as display, high speed radio frequency (RF) switching device, etc.

As described above, according to example embodiments, graphene may be easily transferred while preventing (or minimizing) pollution and damage of graphene, and thus, when a graphene applied device (transistor, etc.) is manufactured by using the method, a device having an excellent performance may be obtained. The device may also be manufactured by using large area graphene after transferring graphene in a wafer level/scale, and thus productivity may be improved. In addition, a protection metal layer having an excellent contact characteristic with graphene may be used as an electrode of the device, and thus the device having the excellent performance may be easily manufactured.

The foregoing is illustrative of example embodiments and is not to be construed as limiting thereof. Although a few example embodiments have been described, those skilled in the art will readily appreciate that many modifications are possible in example embodiments without materially departing from the novel teachings. For example, it will be understood by those skilled in the art that various changes in form and details may be made to the graphene transfer method according to example embodiments. For example, the underlayer UL1 may not be used, and a fixing jig may be used instead of or in addition to the fixing member FM10. A desired device may be manufactured on the graphene layer GP1 after removing the protection metal layer PM1 from the substrate structure of FIG. 1H. The graphene transferred according to the example embodiments may be applied to various devices for various purposes. Accordingly, all such modifications are intended to be included within the scope of the disclosure as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A graphene transfer method, comprising:
    forming a catalyst layer on a first substrate;
    forming a graphene layer on the catalyst layer;
    forming a protection metal layer on the graphene layer;
    attaching a supporter to the protection metal layer;
    separating the first substrate from the catalyst layer such that the protection metal layer, the graphene layer, and the catalyst layer remain on the supporter;
    removing the catalyst layer from the supporter; and
    transferring the protection metal layer and the graphene layer from the supporter to a second substrate.

2. The graphene transfer method of claim 1, wherein
    a size of the protection metal layer is smaller than a size of the graphene layer, and
    an outer portion of the graphene layer is exposed by the protection metal layer.

3. The graphene transfer method of claim 2, wherein the attaching of the supporter to the protection metal layer includes bonding the outer portion of the graphene layer to the supporter.

4. The graphene transfer method of claim 2, further comprising:
    removing the outer portion of the graphene layer exposed by the protection metal layer such that a portion of the catalyst layer is exposed, after the forming of the protection metal layer and prior to the attaching of the supporter to the protection metal layer, and
    wherein the attaching of the supporter to the protection metal layer includes bonding the exposed portion of the catalyst layer to the supporter.

5. The graphene transfer method of claim 1, wherein the protection metal layer includes at least one of Au, Cu, Ni, Ti, Fe, Ru, Pd, Al and combinations thereof.

6. The graphene transfer method of claim 1, wherein the forming of the protection metal layer includes performing an evaporation process.

7. The graphene transfer method of claim 1, further comprising:
    providing an insulating layer between the first substrate and the catalyst layer,
    wherein the separating of the first substrate includes separating the catalyst layer and the insulating layer from each other.

8. The graphene transfer method of claim 1, further comprising:
    providing an insulating layer between the first substrate and the catalyst layer,
    wherein the separating of the first substrate includes removing at least a portion of the insulating layer.

9. The graphene transfer method of claim 1, wherein a size of the supporter is greater than a size of the first substrate.

10. The graphene transfer method of claim 9, further comprising:
    providing a fixing member configured to attach to an outer portion of the supporter.

11. The graphene transfer method of claim 1, wherein the transferring of the protection metal layer and the graphene layer from the supporter to the second substrate includes,
    attaching the second substrate to the graphene layer; and
    removing the supporter from the protection metal layer.

12. The graphene transfer method of claim 11, wherein the attaching of the second substrate to the graphene layer includes,
    providing deionized water between the graphene layer and the second substrate;
    bonding the graphene layer and the second substrate having the deionized water interposed therebetween; and
    drying the graphene layer and the second substrate.

13. The graphene transfer method of claim 1, wherein at least one of the first substrate and the second substrate is a wafer level substrate.

14. A method of manufacturing a graphene applied device, the method comprising:
    transferring the graphene layer and the protection metal layer from the first substrate to the second substrate according to the method of claim 1; and
    forming the graphene applied device such that the graphene layer on the second substrate is incorporated into the graphene applied device.

15. The method of claim 14, wherein the forming of the graphene applied device includes forming at least one electrode from the protection metal layer.

16. The method of claim 14, wherein the graphene applied device includes a transistor.

17. A graphene transfer method, comprising:
    forming a thin film including a graphene layer on a first substrate;
    forming a protection layer having a size smaller than a size of the graphene layer on the thin film such that a portion of the thin film around the protection layer is exposed;
    attaching a supporter to the protection layer and the exposed portion of the thin film;
    separating the first substrate from the thin film such that the protection layer and the thin film remain on the supporter; and
    transferring the graphene layer from the supporter to a second substrate.

18. The graphene transfer method of claim 17, wherein the thin film further includes a catalyst layer provided between the first substrate and the graphene layer.

19. The graphene transfer method of claim 18, wherein the attaching of the supporter to the protection layer and the exposed portion of the thin film includes bonding at least one of the graphene layer and the catalyst layer to the supporter.

* * * * *